United States Patent
Byun et al.

(10) Patent No.: US 7,882,344 B2
(45) Date of Patent: Feb. 1, 2011

(54) MEMORY SYSTEM HAVING A COMMUNICATION CHANNEL BETWEEN A FIRST PROCESSOR AND A SECOND PROCESSOR AND MEMORY MANAGEMENT METHOD THAT USES THE COMMUNICATION CHANNEL

(75) Inventors: Sung-Jae Byun, Yongin-si (KR); Young Min Lee, Suwon-si (KR); Yun-Tae Lee, Seoul (KR); Gyoo-Cheol Hwang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 595 days.

(21) Appl. No.: 11/553,201

(22) Filed: Oct. 26, 2006

(65) Prior Publication Data

US 2007/0136536 A1  Jun. 14, 2007

(30) Foreign Application Priority Data

Dec. 6, 2005  (KR) ............... 10-2005-0118326

(51) Int. Cl.
*G06F 15/177* (2006.01)
(52) U.S. Cl. ............... 713/2; 713/1; 711/149; 711/153
(58) Field of Classification Search ............ 713/1, 713/2; 711/147, 149, 153, 103, 173
See application file for complete search history.

(56) References Cited

U.S. PATENT DOCUMENTS

| | | | |
|---|---|---|---|
| 4,943,911 A * | 7/1990 | Kopp et al. .......... | 713/2 |
| 5,155,833 A | 10/1992 | Cullison et al. | |
| 5,297,260 A * | 3/1994 | Kametani .......... | 710/113 |
| 6,253,293 B1 | 6/2001 | Rao et al. | |
| 6,438,687 B2 * | 8/2002 | Klein .......... | 713/1 |
| 6,584,560 B1 * | 6/2003 | Kroun et al. .......... | 713/2 |
| 7,305,544 B2 * | 12/2007 | Bulusu et al. .......... | 713/2 |
| 2002/0052959 A1 | 5/2002 | Freitas et al. | |

FOREIGN PATENT DOCUMENTS

| | | |
|---|---|---|
| DE | 3639571 A1 | 11/1986 |
| DE | 102004009497 B3 | 2/2004 |
| JP | 08161283 A * | 6/1996 |
| JP | 2000-242610 | 9/2000 |
| JP | 2002-091934 | 3/2002 |
| KR | 1999-0055450 | 7/1999 |
| TW | 446909 B | 7/2001 |

OTHER PUBLICATIONS

German Office Action dated Sep. 22, 2008 in corresponding German Application No. 10 2006 058 875.4-53.
Office Action dated Sep. 27, 2010 for application No. P47078DE issued by the German Patent Office.

* cited by examiner

*Primary Examiner*—Thuan N Du
(74) *Attorney, Agent, or Firm*—F. Chau & Associates, LLC

(57) ABSTRACT

A multi-processor system includes a first processor, a second processor communicable with the first processor, a first non-volatile memory for storing first codes and second codes to respectively boot the first and second processors, the first memory communicable with the first processor, a second volatile memory designated for the first processor, a third volatile memory designated for the second processor, and a fourth volatile memory shared by the first and second processors.

31 Claims, 15 Drawing Sheets

MEMORY SYSTEM HAVING A COMMUNICATION CHANNEL BETWEEN A FIRST PROCESSOR AND A SECOND PROCESSOR AND MEMORY MANAGEMENT METHOD THAT USES THE COMMUNICATION CHANNEL

The present invention claims the benefit of Korean Patent Application No. 2005-0118326 filed in Korea on Dec. 6, 2005, which is hereby incorporated by reference.

BACKGROUND

1. Field of the Invention

The present invention relates to a memory system, and more particularly, a memory system and a memory management method including the same that reduce the number of memories therein.

2. Discussion of the Related Art

As the world is moving into the mobile multi-media era, portable multi-media devices incorporate more micro-processors and need larger and faster memory capacity to handle the multi-media data while maintaining the compactness of the devices. For example, a multi-media system may include two or more micro-processors, such as an application processor and a modem.

In general, each micro-processor requires its own non-volatile memories for holding its respective program codes and data, e.g., boot codes, such that program codes and data are not lost when the power supply is unavailable. In addition, each micro-processor requires additional memories for providing processing memory spaces. Such processing memories typically are volatile memories to reduce the manufacture cost.

Thus, the multi-media system generally includes one non-volatile memory and one volatile memory for each micro-processor in the system. In particular, as the number of micro-processors increases, the number of the memories also increases, thereby requiring more platform area and higher power consumption.

FIG. 7 is a schematic diagram illustrating a multi-processor system according to the related art. As shown in FIG. 7, a multi-processor system includes at least two processors, such as an application processor ("AP") 1 and a modem processor ("MODEM") 2. Each of the application processor 1 and the modem processor 2 requires a non-volatile memory for holding its respective management information.

In particular, the modem processor 2 is directly connected to a first flash memory 3. In addition, the modem processor 2 is connected to a first volatile memory 4. Further, the application processor 1 is directly connected to a second volatile memory 5 and is connected to a second flash memory 6. The first and second volatile memories 4 and 5 respectively provide processing memory spaces for the application processor 1 and the modem processor 2, and may be one of a mobile DRAM ("MDRAM") an a random-accessible DRAM, such as UtRAM™. The first and second flash memories 3 and 6 respectively hold program codes and data for the application processor 1 and the modem processor 2, and may be one of NOR flash memory, a NAND flash memory and an OneNAND™ flash memory, which takes advantages from high-speed data read function of a NOR flash memory and the advanced data storage function of a NAND flash memory.

FIG. 8 is a schematic diagram illustrating another multi-processor system according to the related art, and FIG. 9 is a schematic diagram illustrating the dual-port memory shown in FIG. 8. As shown in FIG. 8, each of the application processor 1 and the modem processor 2 requires a non-volatile memory for holding its respective program codes and data, e.g., boot codes. In addition, the application processor 1 and the modem processor 2 share a conventional dual-port volatile memory 7, such as dual-port RAM memory.

As shown in FIG. 9, the conventional dual-port volatile memory has a first port PORT1 and a second port PORT2, which may respectively be connected to external devices, such as the application processor 1 and the modem processor 2 (shown in FIG. 5). Memory cells of the dual-port volatile memory 7 are accessible via both the first port PORT1 and the second port PORT2 simultaneously. For example, if a first memory address signal received via the first port PORT1 and a second memory address signal received via the second port PORT2 are the same, that is, is the external devices request to access the same memory cell of the dual-port memory, access collision would occur.

SUMMARY OF THE INVENTION

Accordingly, the present invention is directed to a memory system and a memory management method including the same that substantially obviate one or more problems due to limitations and disadvantages of the related art.

An object of the present invention is to provide a memory system and a memory management method including the same that reduce the number of memories therein and provide an increased data speed between microprocessors.

Another object of the present invention is to provide a memory system and a memory management method including the same that simplify data flow into only one non-volatile memory component.

Yet, another object is to provide a memory system and a memory management method including the same that update data throughput between microprocessors via a dual-port RAM ("DPRAM") or a pseudo dual-port RAM ("PDP RAM") having access protection without altering standardized interface between microprocessors.

Still another object of the present invention is to provide a memory system and a memory management method including the same that reduce the required number of memory components, minimize the required area for memory components and lower the system cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a system includes a first processor, a second processor communicable with the first processor, a first memory for storing first codes and second codes to respectively boot the first and second processors, the first memory communicable with the first processor, a second memory designated for the first processor, a third memory designated for the second processor, and a fourth memory shared by the first and second processors.

In another aspect, a system includes a first processor, a second processor, a first memory connected to the first processor for storing first codes and second codes to respectively boot the first and second processors, and a component connected to the first and second processors, the component having a first memory region designated for the first processor, a second memory region designated for the second processor, and a third memory region shared by the first and second processors.

In yet another aspect, a method for booting a system including a first processor and a second processor includes fetching a first code in a first memory to boot the first processor, fetching second codes and third codes in the first memory by the first processor, storing the fetched second code in the first processor, storing the fetched third code in a second memory, and booting the second processor based on the second and third codes.

In still another aspect, a method for booting a system including a first processor and a second processor includes booting the first processor based on a first code stored in a first memory, accessing the first memory by the first processor to fetch a second code from the first memory, storing the fetched second code in the first processor, initializing a component, the component communicable to the first and second processors, accessing the first memory by the first processor to fetch a third code from the first memory, accessing the component by the first processor to store the fetched third code in the component, and accessing the component by the second processor to boot the second processor based on the stored third code.

In another aspect, a method for sharing a memory between a first processor and a second processor includes transmitting a token from a first processor to a second processor, accessing a first memory by the second processor if the token is received, the first memory accessible by one of the first and second processors at a time, after accessing the first memory, transmitting the token from the second processor to the first processor, and accessing the first memory by the first processor if the token is received.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to preferred embodiments of the present invention, examples of which are illustrated in the accompanying drawings.

Figure 1A:
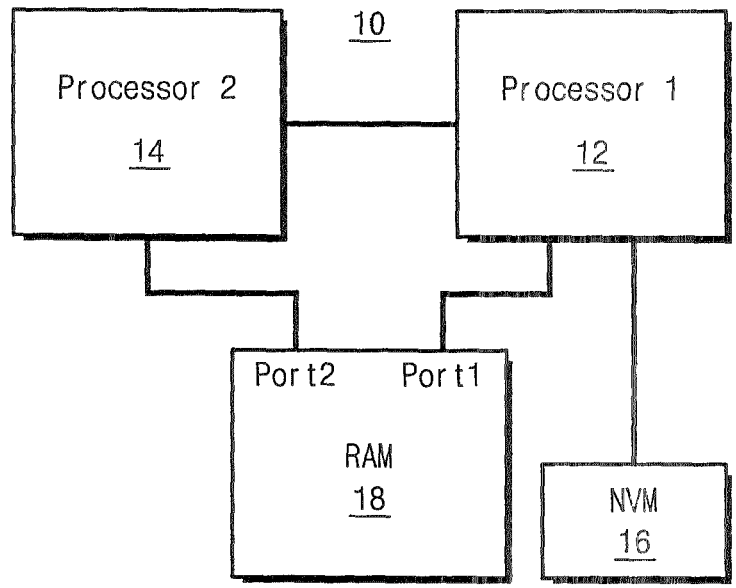
FIG. 1A is a schematic diagram illustrating a memory system according to an embodiment of the present invention.

FIG. 1A is a schematic diagram illustrating a memory system according to an embodiment of the present invention. In FIG. 1A, a multi-processor system 10 includes a first processor 12, a second processor 14, a first memory 16 and a second memory 18. The first and second processors 12 and 14 are connected to be communicable with each other. In addition, the first processor is connected to the first memory 16, and each of the first and second processors 12 and 14 is connected to the second memory 18 via separate ports.

Figure 1B:
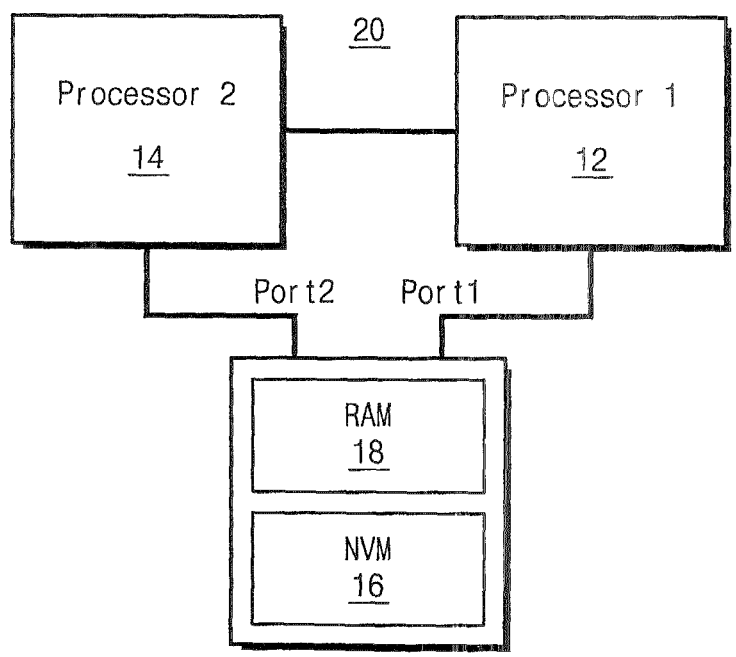
FIG. 1B is a schematic diagram illustrating a memory system according to another embodiment of the present invention.
Figure 1C:
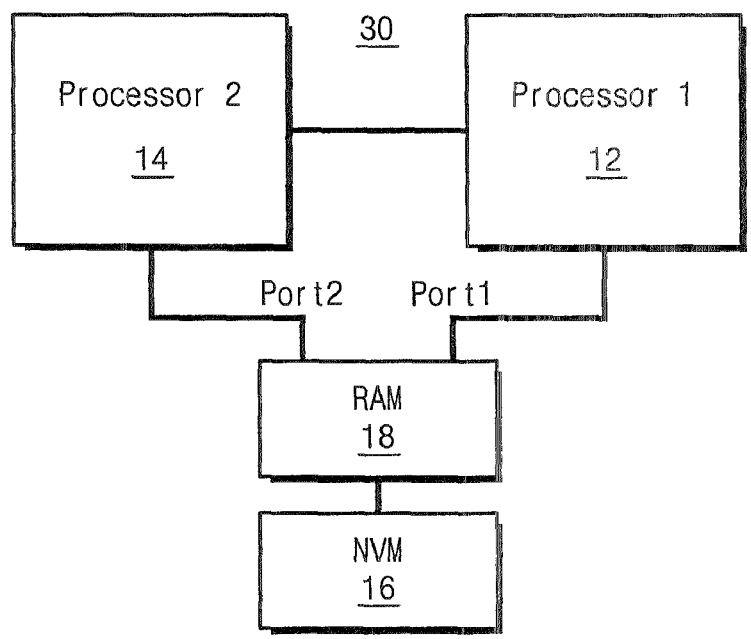
FIG. 1C is a schematic diagram illustrating a memory system according to yet another embodiment of the present invention.
Figure 1D:
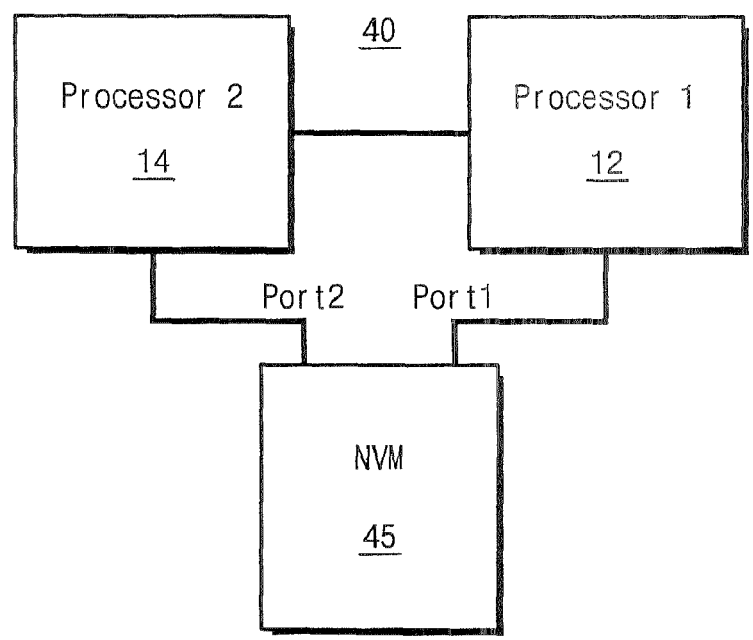
FIG. 1D is a schematic diagram illustrating a memory system according to still another embodiment of the present invention.

FIG. 1B is a schematic diagram illustrating a memory system according to another embodiment of the present invention, FIG. 1C is a schematic diagram illustrating a memory system according to yet another embodiment of the present invention, and FIG. 1D is a schematic diagram illustrating a memory system according to still another embodiment of the present invention. As shown in FIG. 1B, the first and second memories 16 and 18 instead may be formed integrally as a multi-port hybrid chip in a multi-processor system 20.

Alternatively, as shown in FIG. 1C, the first and second memories 16 and 18 alternatively may be connected to each other in a multi-processor system 30. Moreover, as shown in FIG. 1D, one dual-port non-volatile memory 45 instead may be incorporated in a multi-processor system 40, and such a dual-port memory includes memory spaces organized into a plurality of memory banks in a manner that will be described in details below.

The systems 10, 20, 30 and 40 may be a part of a portable device, such as a mobile phone, a portable media player (PMP) and a personal digital assistant (PDA), that include two or more processors. For example, the first processor 12 may be a main application processor for the system, and the second processor 14 may be a modem for the system. The first memory 16 may be a non-volatile memory for holding system management information, such as boot codes for the first and second processors 12 and 14, and the second memory 18 may be a volatile memory for providing processing memory spaces for the first and second processors 12 and 14. Moreover, as shown in FIG. 1D, a dual-port non-volatile memory 45 may be instead incorporated for holding system management information, as well as providing processing memory spaces organized into memory banks.

Figure 2A:
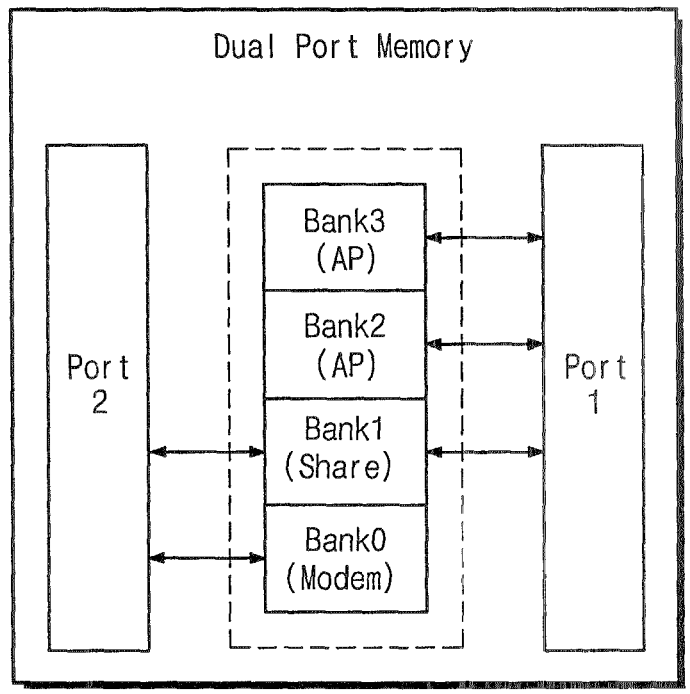
FIGS. 2A to 2C are detailed schematic diagrams respectively illustrating the dual-port memory for the memory system shown in FIGS. 1A to 1C according to different embodiments of the present invention.
Figure 2B:
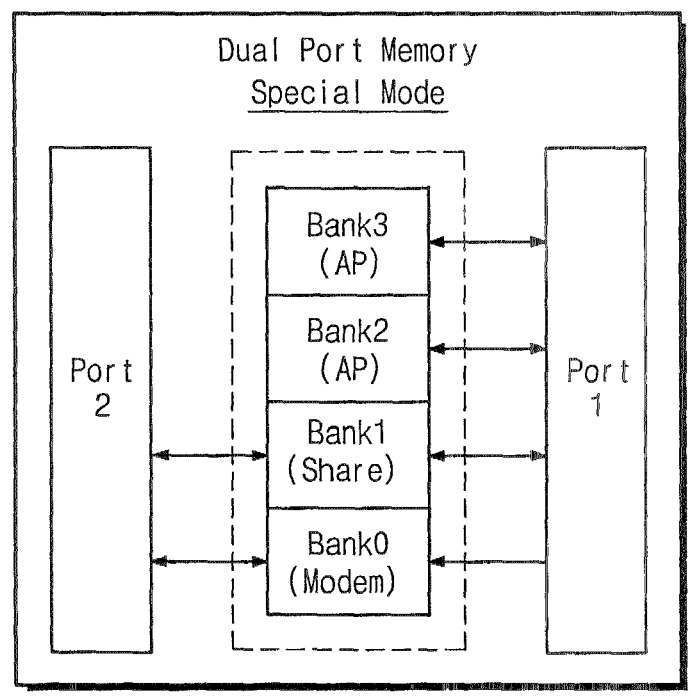
Figure 2C:
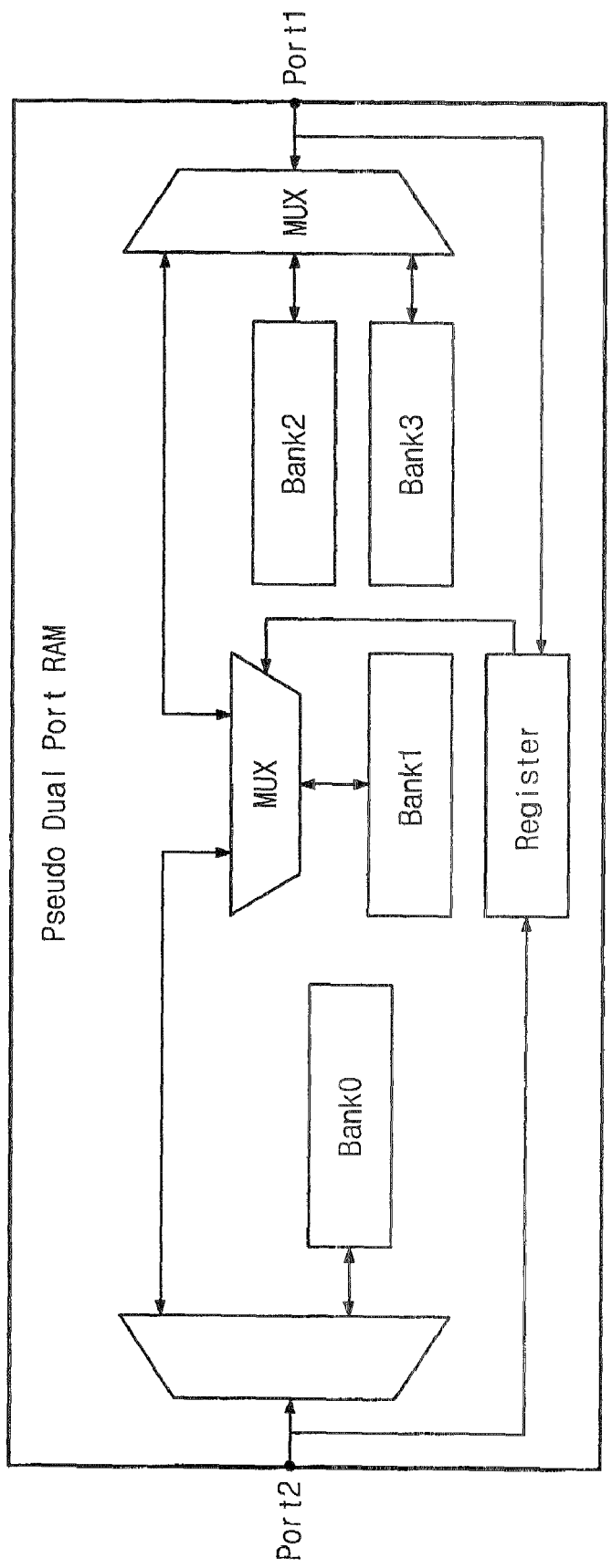

FIGS. 2A to 2C are detailed schematic diagrams respectively illustrating the dual-port memory for the memory system shown in FIGS. 1A to 1C according to different embodiments of the present invention. As shown in FIG. 2A, the dual-port memory includes a plurality of memory spaces organized into a plurality of memory banks, BANK0, BANK1, BANK 2 AND BANK3. Each of the memory banks, BANK0, BANK1, BANK2 AND BANK3, may be constructed to be potentially accessible by both I/O ports PORT1 and PORT2, but an access right to each of the banks, BANK0, BANK1, BANK 2 AND BANK3, is specifically assigned, thereby preventing access collision.

For example, at least one first exclusive bank, BANK 2, is assigned to be accessible exclusively via the first port PORT1, and at least one second exclusive bank, BANK0, is assigned to be accessible exclusively via the second port PORT2. In addition, at least one bank, BANK1, is assigned to be shared by the first and second port PORT1 and PORT2; however, the shared bank BANK1 is assigned to be accessible via one of the first and second ports PORT1 and PORT2 of a given time.

As shown in FIG. 2B, the dual-port memory may have a special operation mode. In a normal mode, the access rights to the banks are as shown in FIG. 2A. In a special mode, a normally exclusive bank may be accessed by another port. For example, in the normal mode, the second exclusive bank BANK0 is assigned to be accessible exclusively via the second port PORT2. In the special mode, the second exclusive bank BANK0 is also accessible via the first port PORT1.

As shown in FIG. 2C, the dual-port memory may further include a plurality of multiplexers MUX for processing data, thereby reducing the number of data I/O ports. The dual-port memory shown in FIGS. 2A to 2C may be a synchronous dynamic random access memory (SDRAM). Alternatively, the dual-port memory may be utilized any suitable volatile memory device, for example, a dynamic random access memory (DRAM), a random access memory (RAM), a read only memory (ROM) and a combination of the foregoing.

Figure 3A:
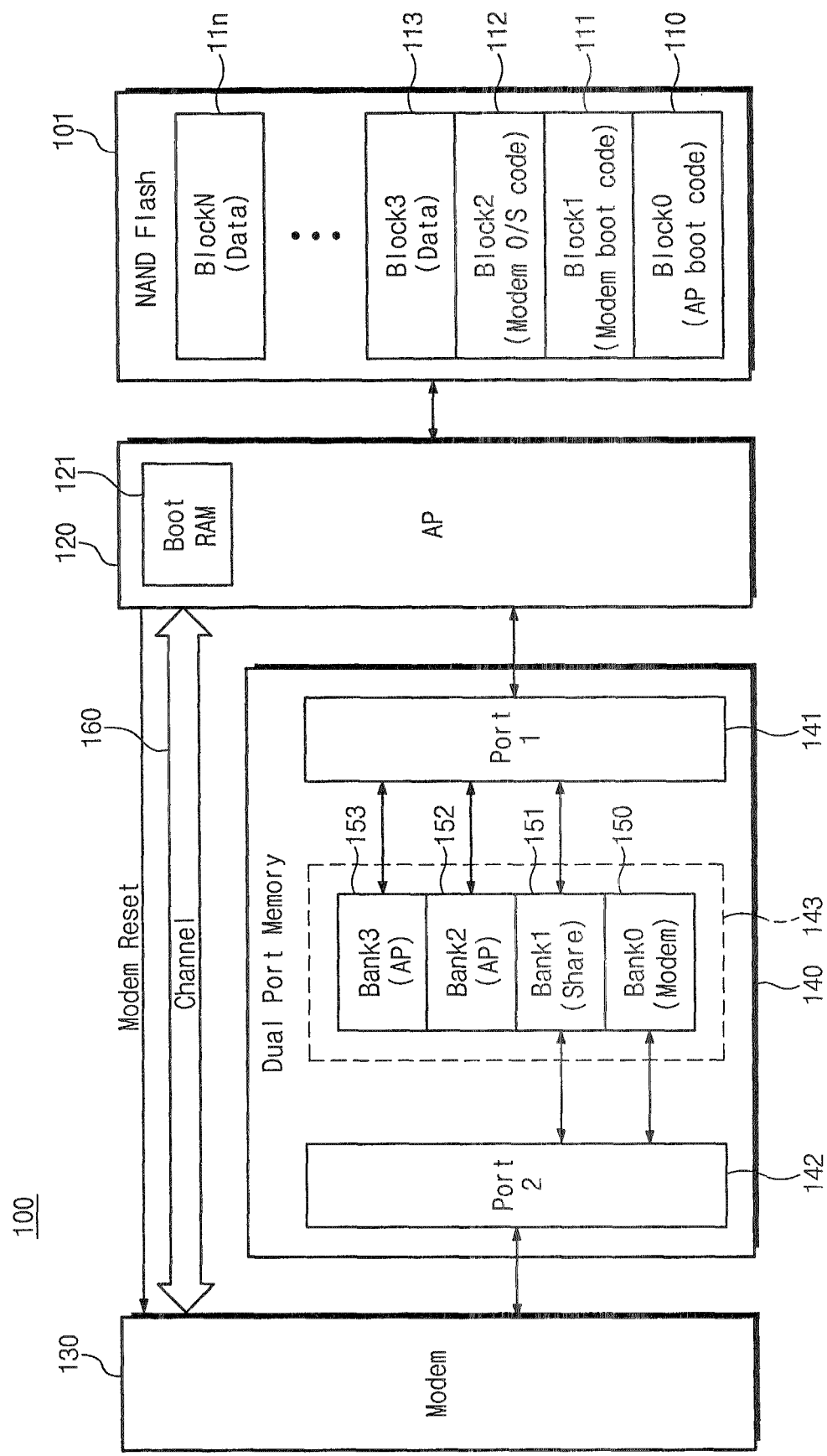
FIG. 3A is a schematic diagram illustrating communication paths of a memory system according to an embodiment of the present invention.
Figure 3B:
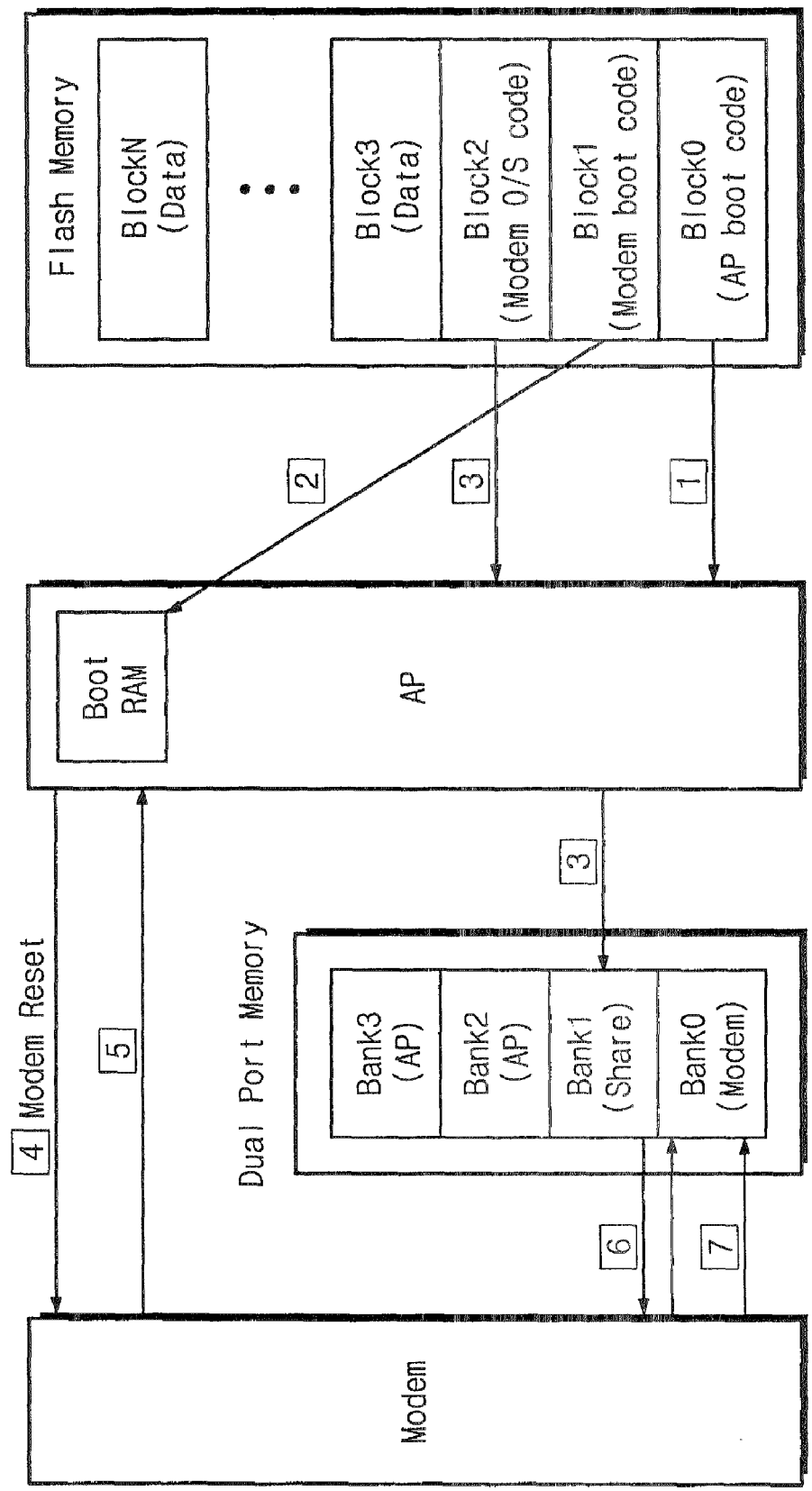
FIG. 3B is a schematic diagram illustrating a start-up communication path in the system shown in FIG. 3A.
Figure 3C:
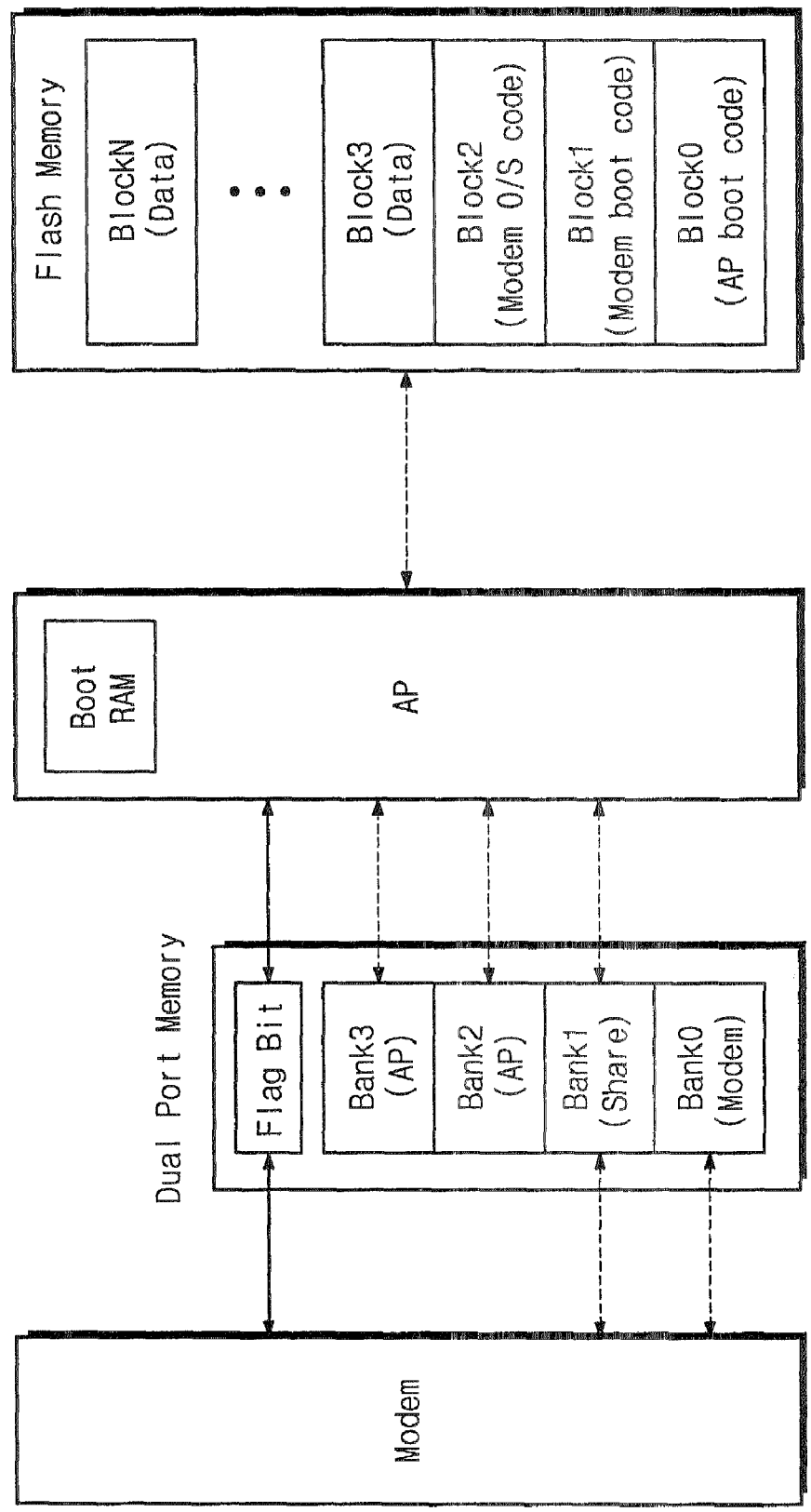
FIG. 3C is a schematic diagram illustrating communication paths in the system shown in FIG. 3A using flag bits according to an embodiment of the present invention.

FIG. 3A is a schematic diagram illustrating communication paths of a memory system according to an embodiment of the present invention, and FIG. 3B is a schematic diagram illustrating a start-up communication path in the system shown in FIG. 3A. In addition, FIG. 3C is a schematic diagram illustrating communication paths in the system shown in FIG. 3A using flag bits according to an embodiment of the present invention.

In FIG. 3A, the system 100 may include a non-volatile memory 101, a first processor 120, a second processor 130, and a dual-port memory 140. The non-volatile memory 101 is connected to the first processor 120. The first and second processors 120 and 130 are connected to each other via a communication channel 160. The communication channel 160 may employ a standardized interface, such as one of SRAM, UART and USB interface, for connecting between the first and second processors 120 and 130.

In addition, each of the first and second processors 120 and 130 is connected to the dual-port memory 140. For example, the first processor 120 is connected to a first port 141 of the dual-port memory 140, and the second processor 130 is connected to a second port 142 of the dual-port memory 140.

The non-volatile memory 101 holds system management information including AP boot code, modem boot code and modem operating software ("O/S") code. In particular, memory cells of the non-volatile memory 101 may be organized into a plurality of blocks 110 . . . 11$n$ ($n$ being a positive integer), and each of the blocks 110 . . . 11$n$ may store respective system management information. For example, the first memory block 110 may store the AP boot code, the second memory block 111 may store the modem boot code, and the third memory block 112 may store the modem O/S code, and the nth memory block 11$n$ may store system data. The non-volatile memory 101 may be a flash memory.

The dual-port memory 140 provides processing memory spaces to both the first and second processors 120 and 130. In particular, memory cells of the dual-port memory 140 are organized into a plurality of banks 150, 151, 152 and 153. At least one bank, 152 or 153, is assigned to be accessible exclusively via the first port 141. At least one bank 150 is assigned to be accessible exclusively via the second port 142, and at least one bank 151 is assigned to be accessible via both the first and second port 141 and 142.

As illustrated in FIG. 3B, during a start-up operation of the system 100, the first processor 120 is booted in accordance with the AP boot code stored in the non-volatile memory 101. The AP boot code may be stored in the first memory block 110 of the non-volatile memory 101, and the first processor 120 is booted in accordance with the AP boot code by accessing the first memory block 110.

After the first processor 120 is booted, the first processor 120 retrieves start-up information for the second processor 130. For example, the modem boot code may be stored in the second memory block 111 of the non-volatile memory 101, and the modem O/S code may be stored in the third memory block 112 of the non-volatile memory 101. Subsequently, the first processor 120 accesses the second memory block 111 to retrieve the modem boot code and stores the retrieved modem boot code in a RAM memory space 121 of the first processor 120. In addition, the first processor 120 accesses the third memory block 112 to retrieve the modem O/S code and stores the retrieved modem O/S code in the shared bank 151 of the dual-port memory 140.

Prior to storing the retrieved modem O/S code in the dual-port memory 140, the first processor 120 may initialize the entire dual-port memory 140. Upon initialization, the register of the dual-port memory 140 may forward an access flag of the shared bank 151 to the first processor 120. After receiving the access flag, the first processor 120 holds the access right to the shared bank 151 and may then begin writing the retrieved modem O/S code in the shared bank 151 via the first port 141.

Subsequently, the first processor 120 releases a modem reset signal to the second processor 130. The modem reset signal may be released by reset signal or via a communication channel 160 between the first and second processors 120 and 130. The reset signal may include the access flag for the shared bank 151, such that the second processor 130 retains the right to access the shared bank 151 to retrieve the modem O/S code. Alternatively, the access flag may be released separately from the first processor 120 to the second processor 130.

After releasing the modem reset signal, the second processor 130 accesses the RAM memory space 121 of the first processor 120 to retrieve the modem boot code. In addition, the second processor 130 accesses the shared bank 151 to retrieve the modem O/S code via the second port 142. In particular, the second processor 130 copies the modem O/S code from the shared bank 151 to the second exclusive bank 150. After copying the modem O/S code in the second exclusive bank 150, the second processor 130 begins to boot in accordance with the modem boot code and the modem O/S code.

Moreover, during the operation of the system 100, the dual-port memory 140 is accessed by the first and second processors 120 and 130. In particular, the first processor 120 may access the first exclusive bank 152 simultaneously as the second processor 130 accessing the second exclusive bank 150.

In addition, a token is generated for each shared memory bank in the dual-port memory 140. For example, a token and a corresponding pointer for the shared bank 151 may be transmitted among the first and second processors 120 and 130 via the communication channel 160.

Prior to accessing the shared bank 151 in the dual-port memory 140, the first and second processors 120 and 130 verify their possession of the token. For example, in order to write data into the shared bank 151 by the second processor 130, the second processor 130 checks whether the token for the shared bank 151 has been transmitted hereto. If the token for the shared bank 151 has been transmitted to the second processor 130, the second processor 130 then accesses the shared bank 151 to perform the data write operation. After the data write operation, the second processor 130 then releases the token to the first processor 120.

Upon receiving the token, the first processor 120 may then access the shared bank 151. Alternatively or in addition, upon receiving the token, the first processor 120 may copy the data in the shared bank 151 to the first exclusive bank 152 prior to retrieving the data.

Further, during a power-down/sleep operation of one of the first and second processors 120 and 130, the other one of the first and second processors 120 and 130 verifies its possession of the token for the shared bank 151. For example, prior to powering-down the first processor 120, if the token for the shared bank 151 has been transmitted to the second processor 130, then the second processor 130 may forward a confirmation signal to the first processor 120. Upon receiving the confirmation signal, the first processor 120 may initiate a power-down/sleep operation.

However, if the token for the shared bank 151 has not been transmitted to the second processor 130, the second processor 130 instead forward a request for the token to the first processor 120. At about the same time, the second processor 130 starts a timer. If the first processor 120 is still in the operational mode, the first processor 120, upon receiving the request, releases the token for the shared bank 151 to the second processor 130.

However, if the timer expires prior to the token being transmitted to the second processor 130, the system would then assume the operation of the first processor 120 is disrupted or the token has been lost in transmission. As such, upon the expiration of the timer, the second processor 130 then generates a substitute token for the shared bank 151.

In addition, during any time of the operation of the system 100, the request for token may be sent by one of the first and second processors 120 and 130 to the other one of the first and second processors 120 and 130. For example, if the first processor 120 needs to access the shared bank 151 and verifies that it does not possess the token, the first processor 120 may forward the request for token to the second processor 130. Upon receiving the request for token, the second processor 130 may release the token to the first processor 120. If the second processor 130 is accessing the shared bank 151 when receiving the request, the second processor 130 may send an acknowledgement signal to the first processor 120, such that the first processor 120 would not generate a substitute token and waits to receive the token to be transmitted from the second processor 130.

As shown in FIG. 3C, alternatively or in addition, the dual-port memory 140 may include a register having flag bits to track the token for the shared bank 151. For example, each of the first and second processors 120 and 130 may check the flag bits to verify possession of the token and to request for the token. In addition, the register may clear the flag bits automatically after the access of the shared bank 151 is completed. In addition, prior to initiating a power-down/sleep operation, the processor 120 or 130 may complete its access to the shared bank 151 before the register clears the flag bits for the token.

Figure 4A:
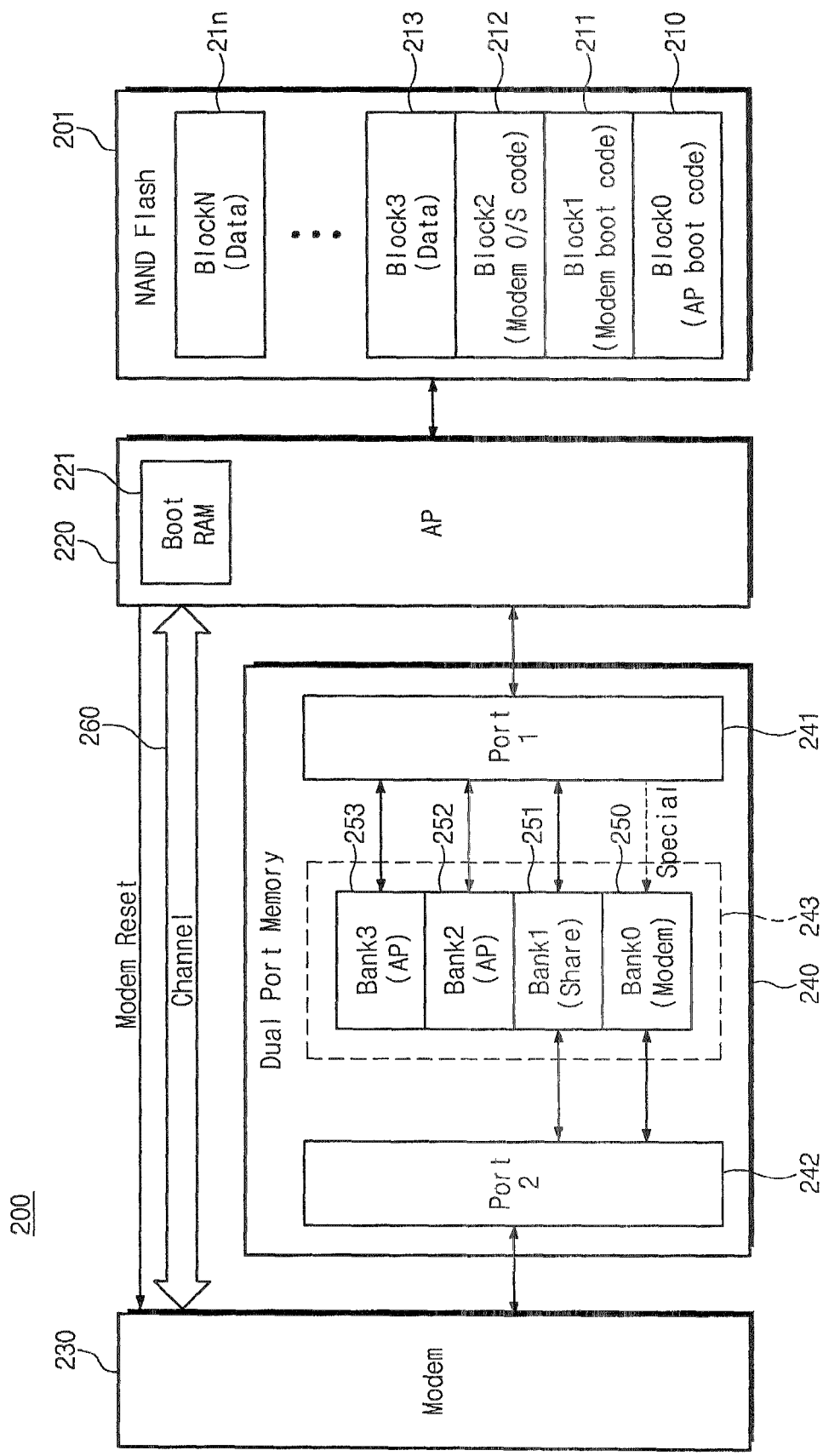
FIG. 4A is a schematic diagram illustrating communication paths of a memory system according to another embodiment of the present invention.
Figure 4B:
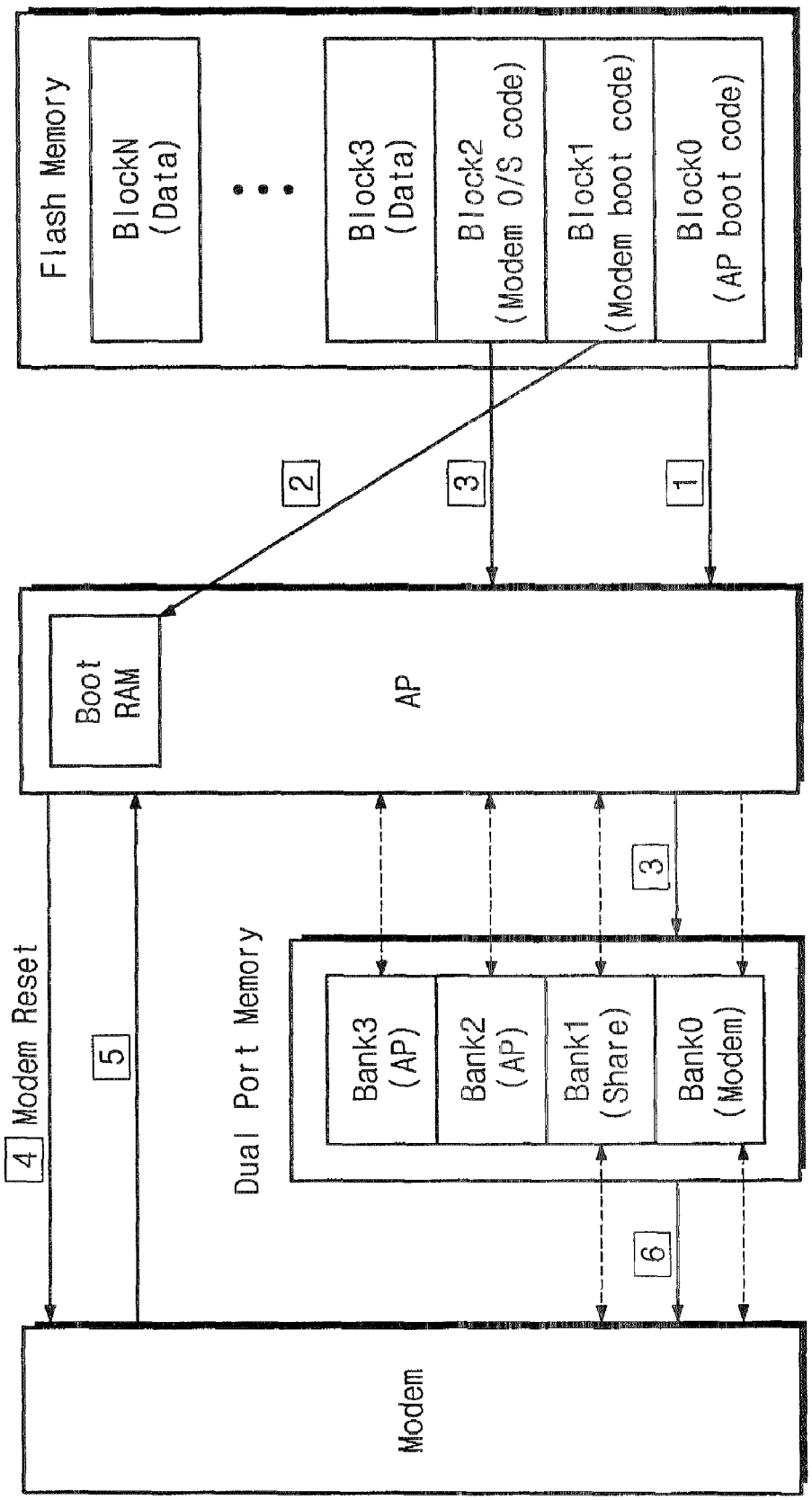
FIG. 4B is a schematic diagram illustrating a start-up communication path in the system shown in FIG. 4A.
Figure 4C:
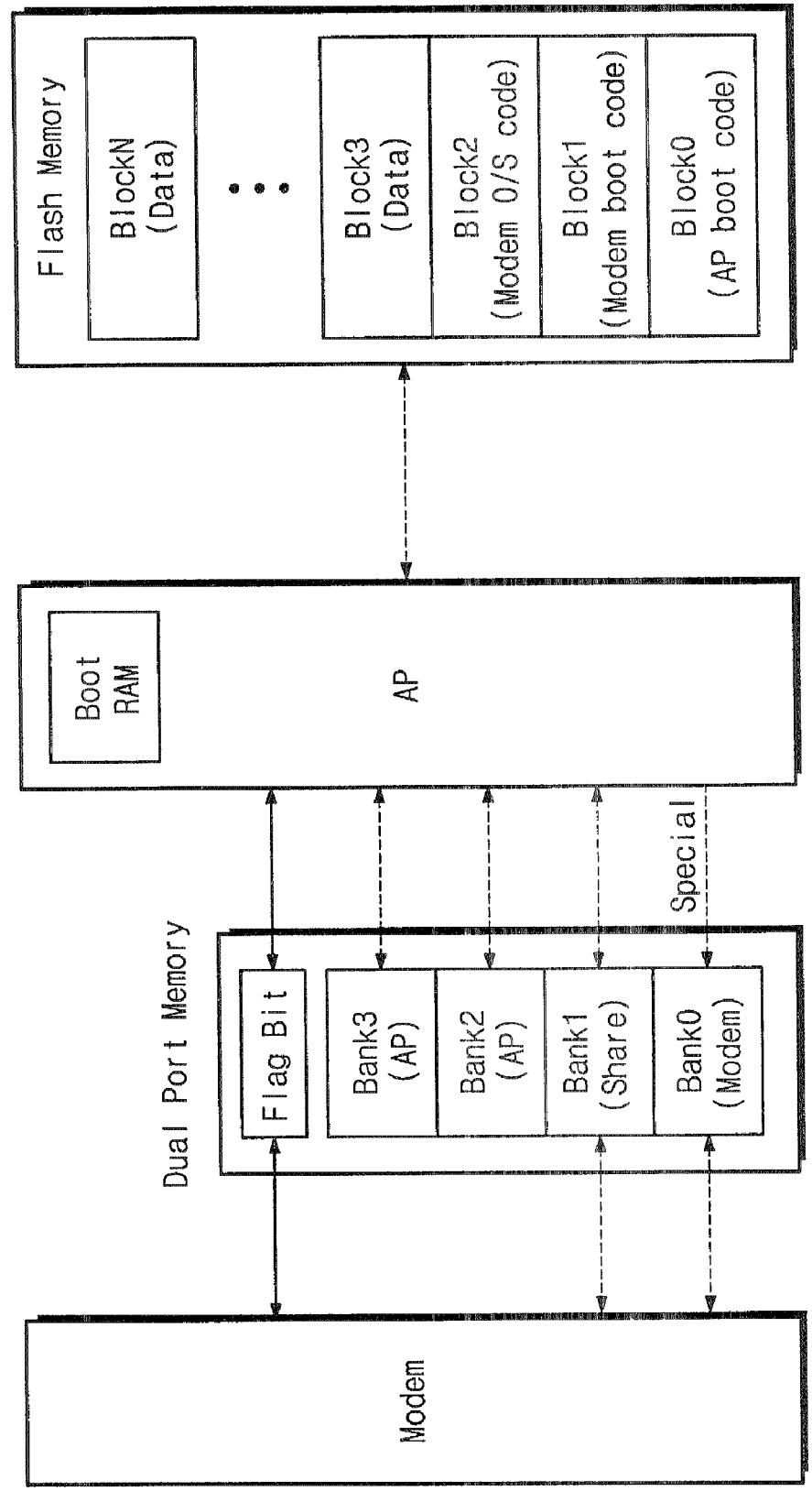
FIG. 4C is a schematic diagram illustrating communication paths in the system shown in FIG. 4A using flag bits according to another embodiment of the present invention.

FIG. 4A is a schematic diagram illustrating communication paths of a memory system according to another embodiment of the present invention, and FIG. 4B is a schematic diagram illustrating a start-up communication path in the system shown in FIG. 4A. In addition, FIG. 4C is a schematic diagram illustrating communication paths in the system shown in FIG. 4A using flag bits according to another embodiment of the present invention.

In FIG. 4A, the system 200 may include a non-volatile memory 201, a first processor 220, a second processor 230, and a dual-port memory 240. The first and second processors 220 and 230 are connected to each other via a communication channel 260. The communication channel 260 may employ a standardized interface, such as one of SRAM, UART and USB interface, for connecting between the first and second processors 220 and 230.

In addition, the dual-port memory 240 has the special operational mode similar to the memory as shown in FIG. 2B. Further, the non-volatile memory 201 holds system management information including AP boot code, modem boot code and modem O/S code. In particular, memory cells of the non-volatile memory 201 may be organized into a plurality of blocks 210 . . . 21n (n being a positive integer), and each of the blocks 210 . . . 21n may store respective system management information. For example, the first memory block 210 may store the AP boot code, the second memory block 211 may store the modem boot code, the third memory block 212 may store the modem O/S code, and the nth memory block 21n may store system date. The non-volatile memory 201 may be a flash memory.

As illustrated in FIG. 4A, during a start-up operation of the system 200, the first processor 220 is booted in accordance with the AP boot code stored in the non-volatile memory 201. The AP boot code may be stored in the first memory block 210 of the non-volatile memory 201, and the first processor 220 is booted in accordance with the AP boot code by accessing the first memory block 210.

After the first processor 220 is booted, the first processor 220 retrieves start-up information for the second processor 230. For example, the modem boot code may be stored in the second memory block 211 of the non-volatile memory 201, and the modem O/S code may be stored in the third memory block 212 of the non-volatile memory 201. As such, the first processor 220 accesses the second memory block 211 to retrieve the modem boot code and stores the retrieved modem boot code in a RAM memory space 221 of the first processor 220. In addition, the first processor 220 accesses the third memory block 212 to retrieve the modem O/S code and stores the retrieved modem O/S code in the dual-port memory 240.

Prior to storing the retrieved modem O/S code in the dual-port memory 240, the first processor 220 may initialize the entire dual-port memory 240. Upon initialization, the dual-port memory 240 is set to the special mode. In the normal mode, the access right to each of the banks of the dual-port memory 240 are shown in solid arrows. In addition, the special mode, a normally exclusive bank may be accessed by an additional port.

For example, in the normal mode, the second exclusive bank 250 is assigned to be accessible exclusively via the second port 242, and in the special mode, the second exclusive bank 250 is also accessible via the first port 241 as shown in the dashed arrow. In the special mode, the register of the dual-port memory 240 may forward a special access flag of the second exclusive bank 250 to the first processor 220. After receiving the special access flag, the first processor 220 holds the special access right to the second exclusive bank 250 and may directly write the retrieved modem O/S code in the second exclusive bank 250 via the first port 241. After writing the modem O/S code in the second exclusive bank 250 by the first processor 220, the first processor 20 releases the special access flag to the dual-port memory 240 and the dual-port memory 240 is set to the normal mode.

In addition, the first processor 220 releases a modem reset signal to the second processor 230. The modem reset signal may be released by reset signal or via the communication channel 260 between the first and second processors 220 and 230.

After receiving the modem reset signal, the second processor 230 accesses the RAM memory space 221 of the first processor 220 to retrieve the modem boot code. In addition, the second processor 230 accesses the second exclusive bank 250 to retrieve the modem O/S code via the second port 242. Subsequently, the second processor 230 begins to boot in accordance with the modem boot code and the modem O/S code.

Moreover, during the operation of the system 200, the dual-port memory 240 is accessed by the first and second processors 220 and 230. In particular, the first processor 220 may access the first exclusive bank 252 simultaneously as the second processor 230 accessing the second exclusive bank 250.

In addition, a token is generated for each shared memory bank in the dual-port memory 240. For example, a token and a corresponding pointer for the shared bank 251 may be transmitted among the first and second processors 220 and 230 via the communication channel 260. Alternatively, the token and the pointer may be transmitted via a register (not shown) of the dual-port memory 240.

Prior to accessing the shared bank 251 in the dual-port memory 240, the first and second processors 220 and 230 verify their possession of the token. For example, in order to write data into the shared bank 251 by the second processor 230, the second processor 230 checks whether the token for the shared bank 251 has been transmitted hereto. If the token for the shared bank 251 has been transmitted to the second processor 230, the second processor 230 then accesses the shared bank 251 to perform the data write operation. After the data write operation, the second processor 230 then releases the token to the first processor 220.

Upon receiving the token, the first processor 220 may then access the shared bank 251. Alternatively or in addition, upon receiving the token, the first processor 220 may copy the data in the shared bank 251 to the first exclusive bank 252 prior to retrieving the data.

As shown in FIG. 4C, alternatively or in addition, the dual-port memory 240 may include a register having flag bits to track the token for the shared bank 251. For example, each of the first and second processors 220 and 230 may check the flag bits to verify possession of the token and to request for the token. In addition, the register may clear the flag bits automatically after the access of the shared bank 251 is completed. In addition, prior to initiating a power-down/sleep operation, the processor 220 or 230 may complete its access to the shared bank 251 before the register clears the flag bits for the token.

Figure 5:
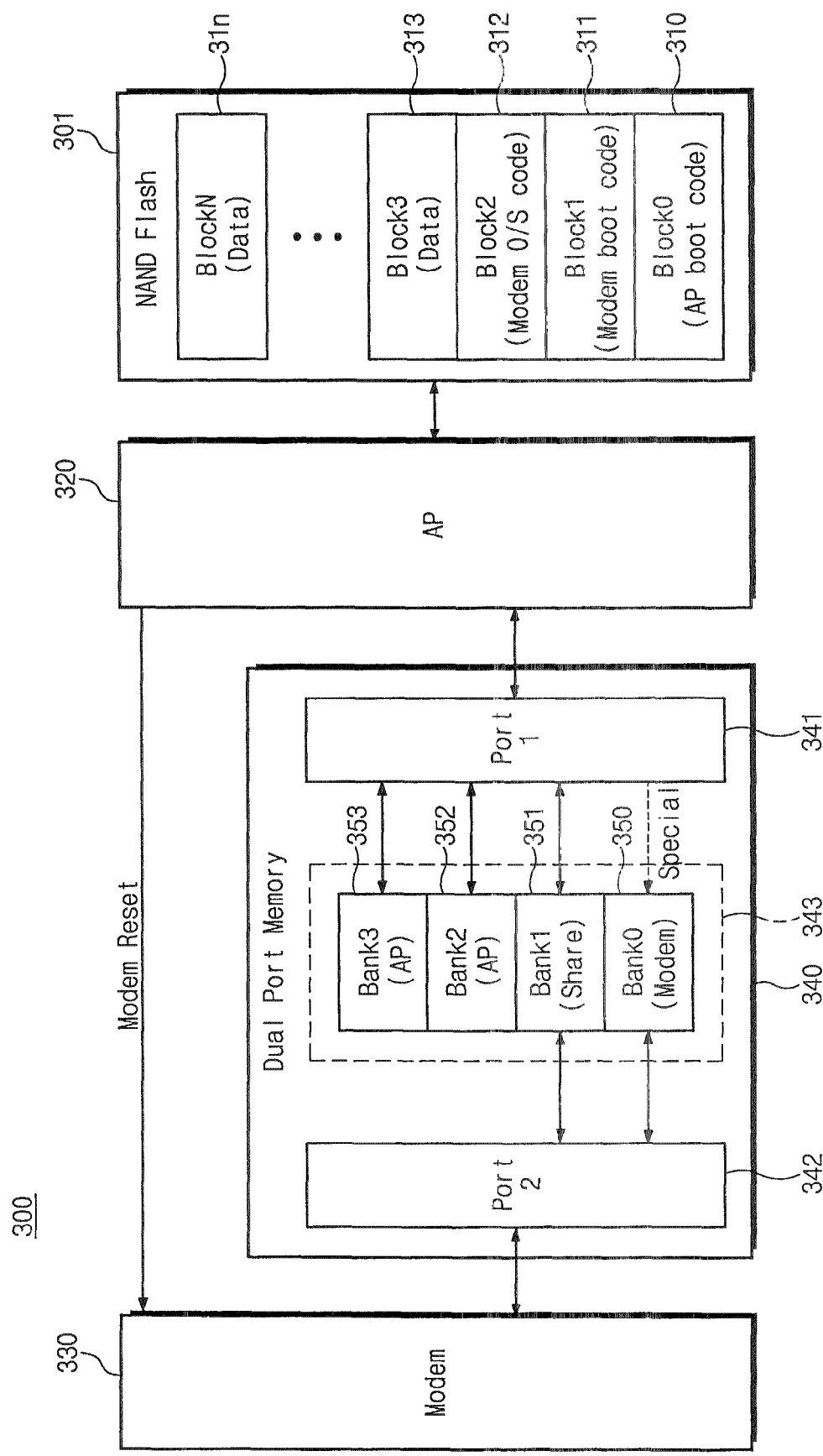
FIG. 5 is a schematic diagram illustrating communication paths of a memory system according to yet another embodiment of the present invention.

FIG. 5 is a schematic diagram illustrating communication paths of a memory system according to yet another embodiment of the present invention. In FIG. 5, the system 300 may include a non-volatile memory 301, a first processor 320, a second processor 330, and a dual-port memory 340. The dual-port memory 340 has the special operational mode as shown in FIG. 2B.

In addition, the non-volatile memory 301 holds system management information including AP boot code, modem boot code and modem O/S code. In particular, memory cells of the non-volatile memory 301 may be organized into a plurality of blocks 310 . . . 31n (n being a positive integer), and each of the blocks 310 . . . 31n may store respective system management information. For example, the first memory block 310 may store AP boot code, the second memory block 311 may store modem boot code, the third memory block 312 may store the modem O/S code, an a the nth memory block 31n may store system data. The non-volatile memory 301 may be a flash memory.

During a start-up operation of the system 300, the first processor 320 is booted in accordance with the AP boot code stored in the non-volatile memory 301. The AP boot code may be stored in the first memory block 310 of the non-volatile memory 301, and the first processor 320 is booted in accordance with the AP boot code by accessing the first memory block 310.

After the first processor 320 is booted, the first processor 320 retrieves start-up information for the second processor 330. For example, the modem boot code may be stored in the second memory block 311 of the non-volatile memory 301, and the modem O/S code may be stored in the third memory block 312 of the non-volatile memory 301. As such, the first processor 320 accesses the second memory block 311 and the third memory block 312 to retrieve the modem boot code an the modem O/S code. In addition, the first processor 320 stores the retrieved model boot code and the modem O/S code in the dual-port memory 340.

Prior to storing the retrieved modem boot code and the retrieved modem O/S code in the dual-port memory 340, the first processor 320 may initialize the entire dual-port memory 340. Upon initialization, the dual-port memory 340 is set to the special mode. In the normal mode, the access right to each of the banks of the dual-port memory 340 are shown in solid arrows. In addition, the special mode, a normally exclusive bank may be accessed by an additional port.

For example, in the normal mode, the second exclusive bank 350 is assigned to be accessible exclusively via the second port 342, and in the special mode, the second exclusive bank 350 is also accessible via the first port 341 as shown in the dashed arrow. In the special mode, the register of the dual-port memory 340 may forward a special access flag of the second exclusive bank 350 to the first processor 320.

After receiving the special access flag, the first processor 320 holds the special access right to the second exclusive bank 350 and may directly write the retrieved modem boot code and the retrieved modem O/S code in the second exclusive bank 350 via the first port 341. After writing the modem boot code and the modem O/S code in the second exclusive bank 350 by the first processor 320, the first processor 320 releases the special access flag to the dual-port memory 340 and the dual-port memory 340 is set to the normal mode.

In addition, the first processor 320 releases a modem reset signal to the second processor 330. After receiving the modem reset signal, the second processor 330 accesses the second exclusive bank 350 to retrieve the modem boot code and the modem O/S code via the second port 342. Subsequently, the second processor 330 begins to boot in accordance with the modem boot code and the modem O/S code.

In the above embodiments, the boot code and the O/S code for the modem processor (or second processor) may be merged into a boot. And the transfer of the boot code for booting and O/S operation may be completed in a step.

Figure 6:
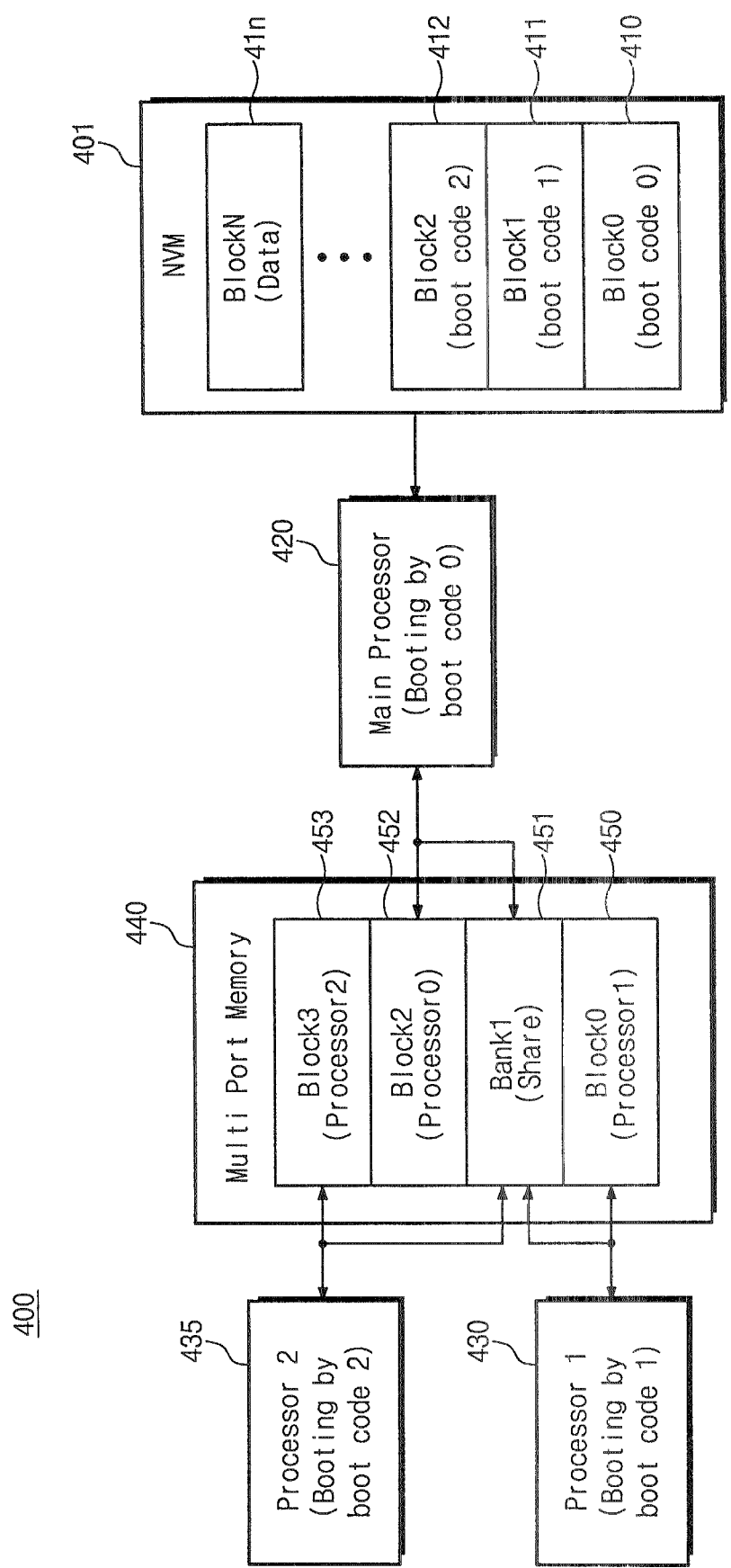
FIG. 6 is a schematic diagram illustrating a memory system according to another embodiment of the present invention.
Figure 7:
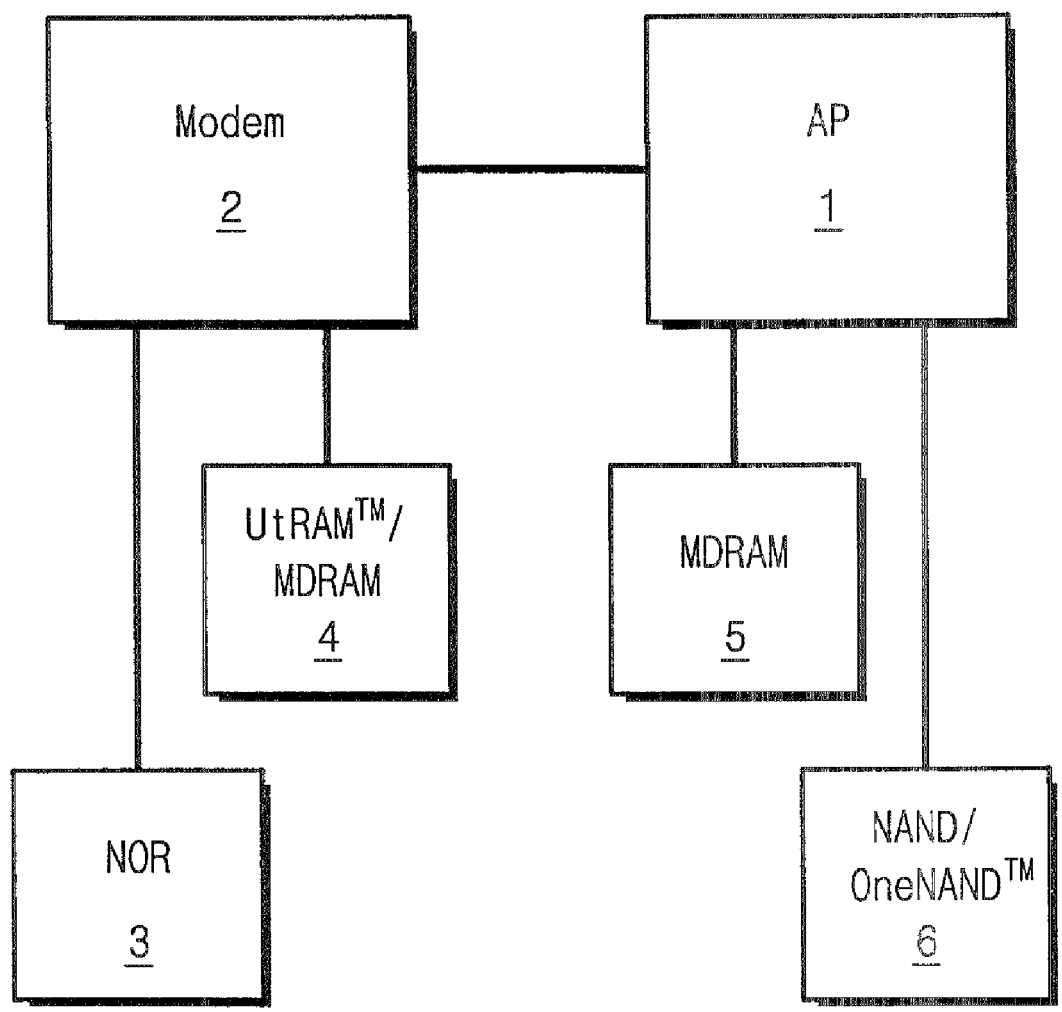
FIG. 7 is a schematic diagram illustrating a multi-processor system according to the related art.
Figure 8:
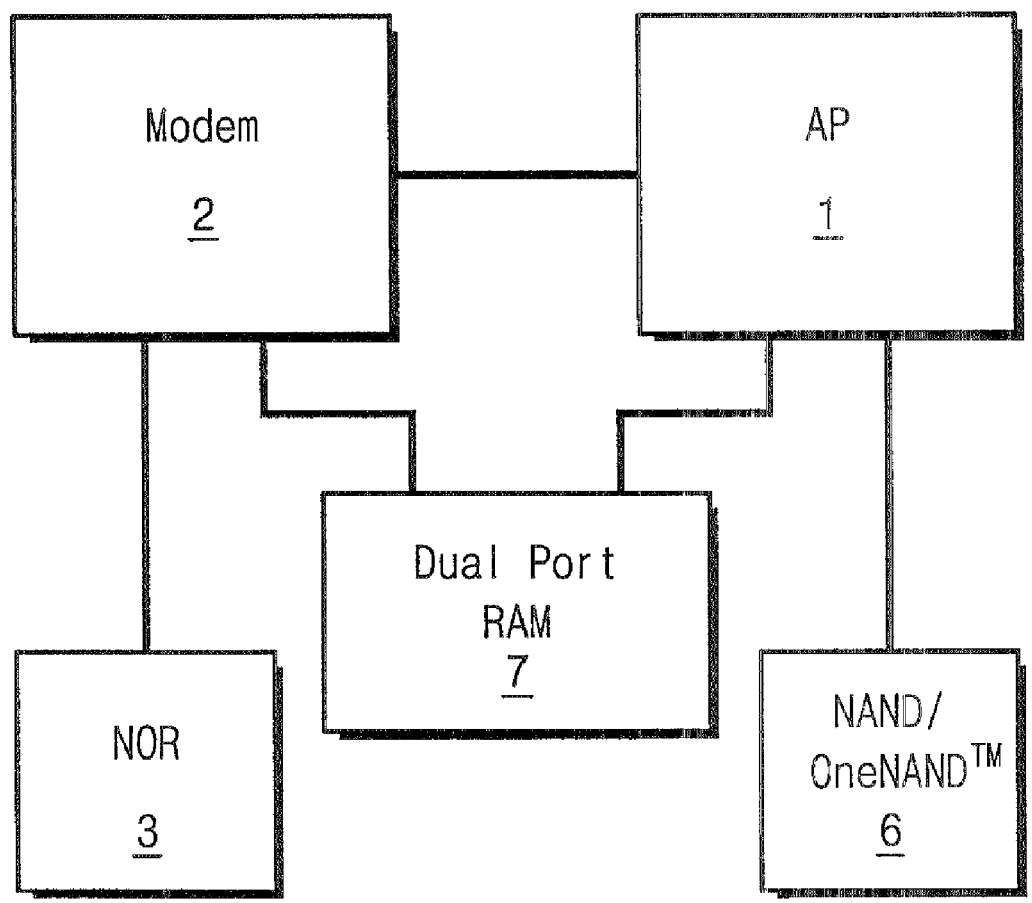
FIG. 8 is a schematic diagram illustrating another multi-processor system according to the related art.
Figure 9:
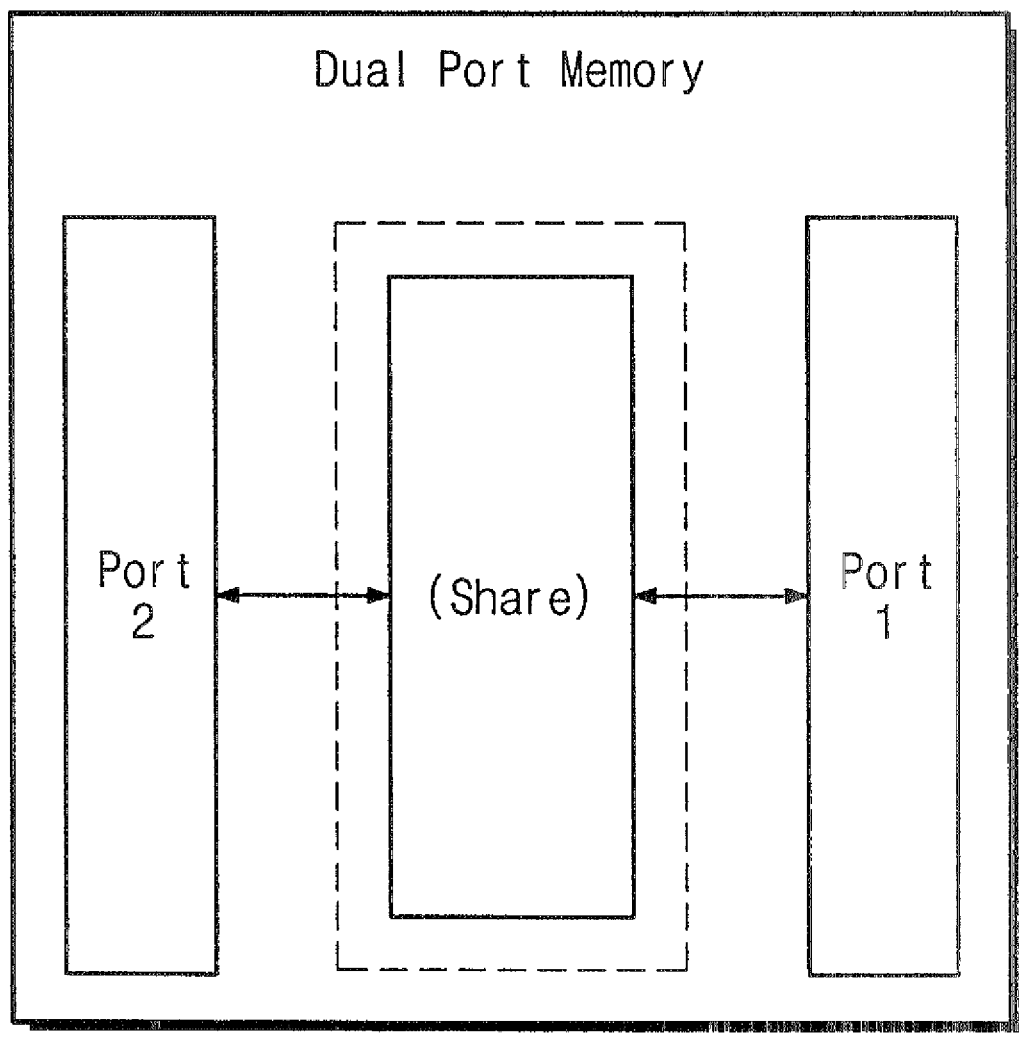
FIG. 9 is a schematic diagram illustrating a dual-port memory shown in FIG. 8.

FIG. 6 is a schematic diagram illustrating communication paths of a memory system according to another embodiment of the present invention. As shown in FIG. 6, the system may include three or more processors. For example, a 3-processor system 400 includes a main processor 420, a first processor 430 and a third processor 435. The system 440 further includes a non-volatile memory 401 for holding system management information and a multi-port memory 440 for providing processing memory space. In particular, memory cells of the non-volatile memory 401 may be organized into a plurality of blocks 410 . . . 41n (n being a positive integer), and each of the blocks 410 . . . 41n may store respective system management information.

For example, the first memory block 410 may store boot code 0 for booting the main processor 420, the second memory block 411 may store boot code 1 for booting the first processor 430, the third memory block 412 may store boot code 2 for booting the second processor 435, and the nth memory block 41n may store system data. The flash memory 401 may be a flash memory.

In addition, each of the three processors 420, 430 and 435 connects the multi-port memory 440 via separate ports. The multi-port memory 440 includes a plurality of memory spaces organized into a plurality of memory banks, 450, 451, 452 and 453. For example, the first memory bank 450 is assigned to be accessible exclusively by the first processor 430, the second memory bank 451 is assigned to be shared by the processors 420, 430 and 435, the third memory bank 452 is assigned to be accessible exclusively by the main processor 420, and the fourth memory bank 453 is assigned to be accessible exclusively by the second processor 435.

Although not shown, the memories in the systems 100, 200, 300 and 400 may be alternatively arranged as shown in FIG. 1B or FIG. 1C. For example, the non-volatile memory 101 and the dual-port memory 140 shown in FIG. 3 may be integrally formed as a multi-port hybrid chip, may be directly connected to each other, as shown in FIG. 1C, or may be incorporated into a multi-port non-volatile memory, as shown in FIG. 1D. Further, for example, the non-volatile memory 301 and the dual-port memory 340 shown in FIG. 5 may be integrally formed as a multi-port hybrid chip, may be directed connected to each other or may be incorporated into a multi-port non-volatile memory.

In addition, although the dual-port memories 140, 240 and 340 may have more than two ports. Further, the dual-port memories 140, 240 and 240 may be pseudo dual-port memories as shown in FIG. 2C.

Moreover, although the first processors 120, 220 and 320 are shown as application processors in FIGS. 3, 4 and 5, the first processors 120, 220 and 320 may be any suitable microprocessors. Similarly, although the second processors 130, 230 and 330 are shown as modem processors in FIGS. 3, 4 and 5, the second processors 130, 230 and 330 may be any suitable microprocessors.

As described above, a multi-processor system and a memory management method including the same according to an embodiment of the present invention have several advantages. For example, in a multi-processor system and a memory management method including the same according to an embodiment of the present invention, one non-volatile memory holds system management information for two or more processors and is connected directly to only one of such processors, to thereby reduce platform area. The non-volatile memory may be organized into a plurality of memory blocks to store system management codes and/or data that are not be lost when the power supply is unavailable.

In addition, in a multi-processor system and a memory management method including the same according to an embodiment of the present invention, two or more processors share one multi-port memory having a plurality of memory banks. At least one of the memory banks is assigned to be exclusively accessed by each processor, and at least one of the memory banks is assigned to be shared by the processors, to thereby reduce power consumption.

Further, in a multi-processor system and a memory management method including the same according to an embodiment of the present invention, two or more processors share one multi-port memory having a plurality of memory banks, in which an access right of a shared memory bank is assigned and controlled, to thereby prevent access collision. The access right may be controlled by a token handshake.

Furthermore, in a multi-processor system and a memory management method including the same according to an embodiment of the present invention, the shared multi-port memory has a special operation mode. In the special operation mode, a normally exclusive memory bank is accessible via an additional port, to thereby increase data transfer rates.

Moreover, in a multi-processor system and a memory management method including the same according to an embodiment of the present invention, the shared multi-port memory includes a register having flag bits to track an access token for the shared memory bank. In particular, the register automatically clears the flag bits after the usage of the shared memory bank is completed.

In addition, in a multi-processor system and a memory management method including the same according to an embodiment of the present invention, prior to a power-down/sleep operation of a processor, the token for the shared memory bank is verified, and if the token is determined to be lost, a substitute token is generated after a predetermined amount of time expires.

It will be apparent to those skilled in the art that various modifications and variations can be made in the memory system and the memory management method including the same of the present invention without departing from the spirit or scope of the invention. Thus, it is intended that the present invention covers the modifications and variations of this invention provided they come within the scope of the appended claims and their equivalents.

What is claimed is:

1. A system, comprising:
a first processor;
a second processor communicable with the first processor;
a first memory for storing first codes to boot the first processor and a start code to boot the second processor, the first memory communicable with the first processor;
a second memory designated for the first processor;
a third memory designated for the second processor; and
a fourth memory shared by the first processor and the second processor,
wherein the first processor fetches the start code from the first memory, the start code is transmitted from the first processor to the second processor via a communication channel between the first processor and the second processor to boot the second processor after releasing a reset state of the second processor, and the fourth memory is accessible to one of the first processor and the second processor at a time.

2. The system according to claim 1, wherein the third memory stores the start codes for booting the second processor fetched from the first memory.

3. The system according to claim 2, wherein the fourth memory stores second codes for operating the second processor fetched from the first memory.

4. The system according to claim 3, wherein the second codes for operating the second processor are copied from the fourth memory to the third memory.

5. The system according to claim 1, wherein the second memory, the third memory and the fourth memory are a part of a volatile memory device connected to the first processor and the second processor, and the first memory is a non-volatile memory device connected to the first processor.

6. The system according to claim 5, wherein the volatile memory device is a dynamic random access memory (DRAM).

7. The system according to claim 1, wherein the second memory, the third memory and the fourth memory are a part of a volatile memory device and the first memory is a non-volatile memory device, the non-volatile memory device and the volatile memory device having a common communication channel to the first processor.

8. The system according to claim 1, wherein the second memory, the third memory and the fourth memory are a part of a volatile memory device, and the first memory is a non-volatile memory device connected to the volatile memory device.

9. The system according to claim 1, the second memory, the third memory and the fourth memory are a part of a non-volatile memory device.

10. The system according to claim 1, wherein the first memory is a reprogrammable non-volatile memory device.

11. The system according to claim 10, wherein the reprogrammable non-volatile memory device is a NAND flash memory.

12. A system, comprising:
a first processor;
a second processor;
a first memory connected to the first processor for storing first codes to boot the first processor and a start code to boot the second processor; and
a component connected to the first processor and the second processor, the component having a first memory region designated for the first processor, a second memory region designated for the second processor, and a third memory region shared by the first processor and the second processor,
wherein the first processor fetches the start code from the first memory, the start code is transmitted from the first processor to the second processor via a communication channel between the first processor and the second processor to boot the second processor after releasing a reset state of the second processor, and the third memory region of the component is accessible to one of the first and second processors at a time.

13. The system according to claim 12, wherein the third memory region of the component stores second codes for operating the second processor fetched from the first memory.

14. The system according to claim 13, wherein the second codes for operating the second processor is copied from the third memory region to the second memory region.

15. The system according to claim 12, wherein the third memory region of the component stores second codes for operating the second processor fetched from the first memory to boot the second processor.

16. The system according to claim 12, wherein the first memory is a non-volatile memory device, and the component is a volatile memory device.

17. The system according to claim 12, wherein the component is a dynamic random access memory (DRAM).

18. A method for booting a system including a first processor and a second processor, comprising:
fetching a first code in a first memory to boot the first processor;
fetching a start code in the first memory by the first processor;
releasing a reset state of the second processor;
transmitting the start code from the first processor to the second processor via a communication channel between the first processor and the second processor;
fetching a second code in the first memory by the first processor; and
storing the fetched second code in a second memory; and
starting the second processor based on the start code.

19. The method according to claim 18, wherein the second code includes operating software code for the second processor.

20. The method according to claim 18, wherein the storing the fetched second code in the second memory includes:
storing the fetched second code in a third memory by the first processor, the third memory shared by the first processor and the second processor; and
copying the fetched second code from the third memory to the second memory by the second processor, the second memory designated for the second processor.

21. The method according to claim 18, wherein the storing the fetched second code in the second memory includes:
setting the second memory in a first mode for the first processor to access the second memory;
storing the fetched second code in the second memory by the first processor; and
setting the second memory in a second mode for the second processor to access the second memory.

22. The method according to claim 18, further comprising:
fetching the second code by the second processor after the release of the reset state of the second processor.

23. The method according to claim 18, further comprising:
initializing the second memory prior to storing the fetched start code.

24. The method according to claim 18, wherein the communication channel has a universal serial bus (USB) interface.

25. The method according to claim 18, wherein the communication channel has a universal asynchronous receiver/transmitter (UART) interface.

26. The method according to claim 18, wherein the first memory is a reprogrammable non-volatile memory device.

27. The method according to claim 26, wherein the reprogrammable non-volatile memory device is a NAND flash memory.

28. A method for booting a system including a first processor and a second processor, comprising:
booting the first processor based on a first code stored in a first memory;
accessing the first memory by the first processor to fetch a start code from the first memory;
initializing a component, the component communicable to the first processor and the second processor;

accessing the first memory by the first processor to fetch a second code from the first memory;

accessing the component by the first processor to store the fetched second code in the component; and transmitting the start code to the second processor via a communication channel between the first processor and the second processor to boot the second processor;

accessing the component by the second processor to operate the second processor based on the stored second code.

29. The method according to claim 28, further comprising releasing a reset signal from the first processor to the second processor, the reset signal corresponding to a right to access a shared memory region of the component.

30. The method according to claim 28, wherein the accessing the component by the second processor to operate the second processor based on the stored second code comprises:

accessing a first memory region of the component by the second processor to store the second code in the first memory region, the first memory region designated for sharing by the first processor and the second processor; and copying the second code stored in the first memory region to a second memory region of the component, the second memory region designated for the second processor.

31. The method according to claim 28, wherein the accessing the component by the first processor to store the fetched second code in the component comprises:

setting the component in a first mode for the first processor to access a second memory region of the component, the second memory region designated for the second processor;

storing the fetched second code in the second memory region by the first processor; and setting the component in a second mode for the second processor to access the second memory region.

\* \* \* \* \*